US011619760B2

(12) United States Patent
Boulaknadal et al.

(10) Patent No.: US 11,619,760 B2
(45) Date of Patent: Apr. 4, 2023

(54) EFFICIENT DAMPED PULSED ENERGY TRANSMITTER

(71) Applicants: Youssef Boulaknadal, Houston, TX (US); Stanislav Forgang, Houston, TX (US); Ryan Rocheleau, Houston, TX (US); Marc Stephen Ramirez, Missouri City, TX (US)

(72) Inventors: Youssef Boulaknadal, Houston, TX (US); Stanislav Forgang, Houston, TX (US); Ryan Rocheleau, Houston, TX (US); Marc Stephen Ramirez, Missouri City, TX (US)

(73) Assignee: BAKER HUGHES OILFIELD OPERATIONS LLC, Houston, TX (US)

( * ) Notice: Subject to any disclaimer, the term of this patent is extended or adjusted under 35 U.S.C. 154(b) by 46 days.

(21) Appl. No.: 17/356,992

(22) Filed: Jun. 24, 2021

(65) Prior Publication Data
US 2022/0413178 A1 Dec. 29, 2022

(51) Int. Cl.
G01V 3/32 (2006.01)
E21B 47/13 (2012.01)
E21B 47/20 (2012.01)
G01N 24/08 (2006.01)

(52) U.S. Cl.
CPC .............. G01V 3/32 (2013.01); E21B 47/13 (2020.05); E21B 47/20 (2020.05); G01N 24/081 (2013.01)

(58) Field of Classification Search
CPC ....... E21B 47/13; E21B 47/20; G01N 24/081; G01V 3/32
See application file for complete search history.

(56) References Cited

U.S. PATENT DOCUMENTS

| 6,686,737 | B2 | 2/2004 | Kruspe et al. |
| 7,164,267 | B2 | 1/2007 | Prammer et al. |
| 7,784,542 | B2 | 8/2010 | Roddy et al. |
| 8,356,673 | B2 | 1/2013 | Bass et al. |
| 9,689,937 | B2 * | 6/2017 | Song ............ G01R 33/34092 |
| 10,545,204 | B2 | 1/2020 | Ji et al. |
| 10,551,520 | B2 | 2/2020 | Saidian et al. |
| 11,171,684 | B1 * | 11/2021 | Zhou ............ G01N 24/081 |

(Continued)

FOREIGN PATENT DOCUMENTS

GB 2295680 A 6/1996

OTHER PUBLICATIONS

Timothy Hopper et al., "Low-frequency NMR with a non-resonant circuit"; Journal of Magnetic Resonance; Feb. 17, 2011; 7 pages.

Primary Examiner — Gregory H Curran
(74) Attorney, Agent, or Firm — Cantor Colburn LLP

(57) ABSTRACT

A device for generating oscillating signals includes an energy transfer device configured to apply an oscillating signal to a sensitive volume, and a resonant tuning circuit including the energy transfer device. The tuning circuit includes a tuning capacitor configured to cause the tuning circuit to resonate at a selected frequency, and an energy storage device. The transmitting device also includes a controller configured to apply a pulse sequence to the tuning circuit having a series of pulses, the energy storage device configured to retain electrical energy at an end of a first pulse, and discharge the electrical energy to the tuning circuit at an onset of a next pulse of the pulse sequence.

20 Claims, 12 Drawing Sheets

(56) References Cited

U.S. PATENT DOCUMENTS

| | | |
|---|---|---|
| 2011/0080172 A1 | 4/2011 | Banning-Geertsma et al. |
| 2017/0016969 A1* | 1/2017 | Eberler ................ G01R 33/365 |
| 2019/0346386 A1 | 11/2019 | Babakhani et al. |
| 2020/0088904 A1 | 3/2020 | Dementyev et al. |

* cited by examiner

EFFICIENT DAMPED PULSED ENERGY TRANSMITTER

BACKGROUND

In the resource recovery industry, various activities and operations are performed in a borehole penetrating a subterranean region, such as an earth formation. Borehole systems such as wireline and drilling system may include various tools and components that use a pulsed network to trigger an oscillating network for the purpose of transferring energy to another medium. For example, nuclear magnetic resonance (NMR) measurements can be utilized, both at surface locations (e.g., laboratories) and downhole locations to estimate various properties of earth formations.

SUMMARY

An embodiment of a device for generating oscillating signals includes an energy transfer device configured to apply an oscillating signal to a sensitive volume, and a resonant tuning circuit including the energy transfer device. The tuning circuit includes a tuning capacitor configured to cause the tuning circuit to resonate at a selected frequency, and an energy storage device. The transmitting device also includes a controller configured to apply a pulse sequence to the tuning circuit having a series of pulses, the energy storage device configured to retain electrical energy at an end of a first pulse, and discharge the electrical energy to the tuning circuit at an onset of a next pulse of the pulse sequence.

A method of generating oscillating signals includes disposing a transmission device proximate to a sensitive volume, the transmission device including an energy transfer device configured to apply an oscillating signal to the sensitive volume, and a resonant tuning circuit including the energy transfer device, the tuning circuit including a tuning capacitor configured to cause the tuning circuit to resonate at a selected frequency, and an energy storage device. The method also includes applying, by a controller, a pulse sequence having a series of pulses to the tuning circuit, wherein the applying includes retaining electrical energy in the energy storage device at an end of a first pulse, and discharging the electrical energy to the tuning circuit at an onset of a next pulse of the pulse sequence.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

Figure 1:
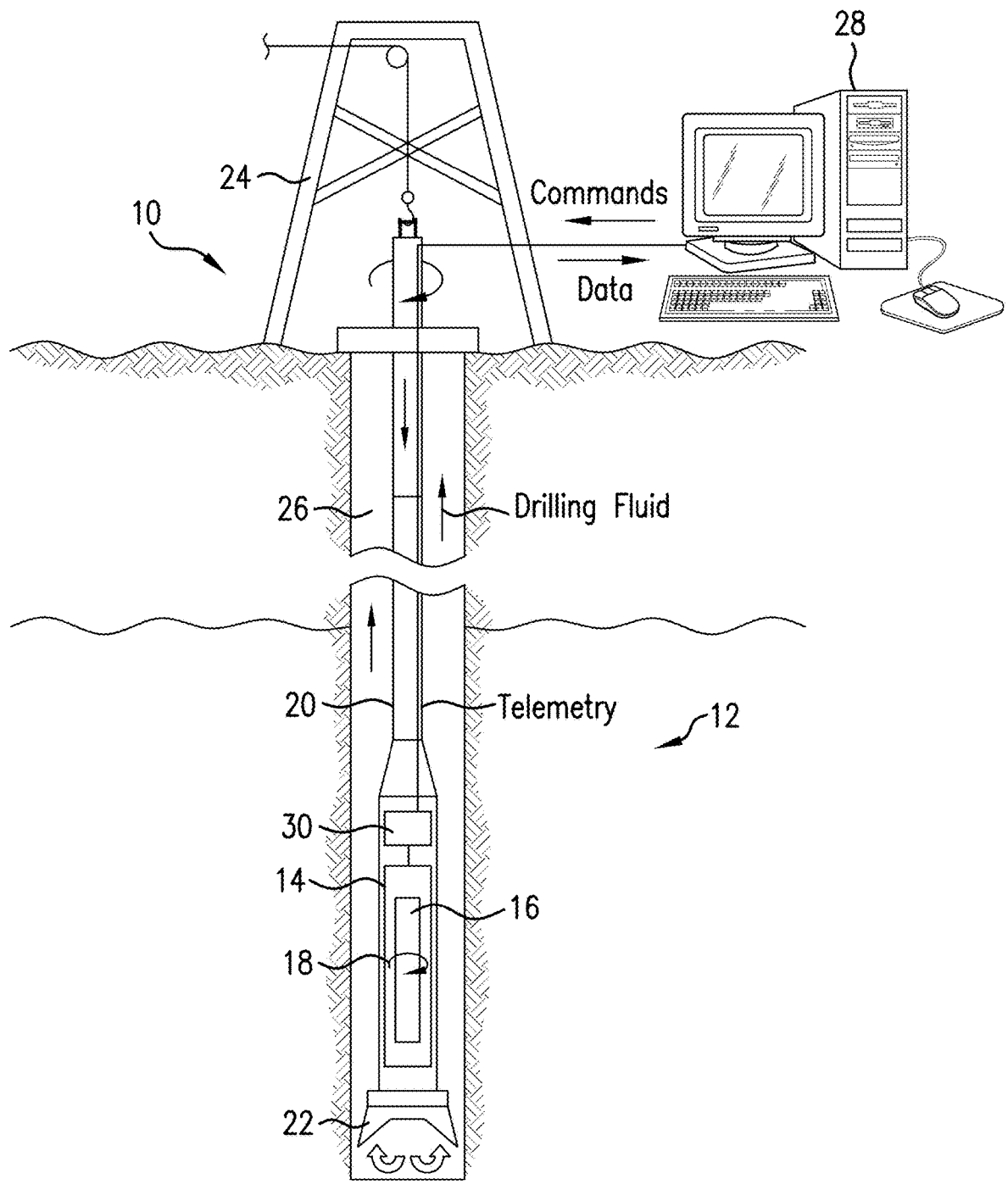
FIG. 1 depicts an embodiment of a formation measurement system that includes a nuclear magnetic resonance (NMR) measurement apparatus or tool.

Apparatuses and methods for generating oscillating signals are described herein. An embodiment of a transmission device or system includes an energy transfer device (e.g., an antenna), and a resonant tuning circuit configured to cause the energy transfer device to emit a pulsed oscillating signal. The energy transfer device may be any suitable device that can generate oscillating signals of various forms of energy, such as magnetic, electric and acoustic energy. For example, the energy transfer device may be or include an antenna used for performing nuclear magnetic resonance (NMR) measurements and/or measuring characteristics of a sensitive volume, such as a formation or other subterranean region.

In an embodiment, the transmission device includes the tuning circuit and a controller configured to drive the circuit to emit a series of pulses, where each pulse includes an oscillating signal having a selected frequency. The oscillating signal is emitted by performing a switching sequence during operation of an NMR, acoustic, electromagnetic-acoustic, or other type of transmitter. The tuning circuit includes an inductor (L) such as an NMR transmitting coil (antenna) and at least one tuning capacitor ($C_{tune}$) forming a LC network that has a selected oscillation frequency. The controller performs a switching sequence to generate a sequence of pulses, each pulse having an oscillating signal having the selected oscillation signal. Each pulse may represent a respective oscillation cycle.

During the oscillation cycle, the tuning circuit enters a transmit mode in which the inductor L is coupled to the tuning capacitor $C_{tune}$ by closing a first switch for a pulse duration to cause the inductor L to emit an oscillating signal during the pulse duration. Subsequent to the transmit mode, the tuning circuit enters a dissipation mode, or "dump" mode, in which a second switch is closed to couple the inductor L to a dissipating component, such as a dump resistor.

An embodiment of the tuning circuit also includes an energy storage device that is configured to momentarily hold energy from an oscillation cycle. The energy storage device holds the energy when the first switch is turned off and until at least an onset of the next oscillation cycle. The held energy can be used to enhance the operation of the energy transfer device, for example, by supplying energy in a subsequent discharge or oscillation cycle. In an embodiment, the energy storage device is a capacitor, which may be connected in series with the dump resistor.

The embodiments described herein present a number of advantages. For example, by holding energy between oscillation cycles, the amount of time needed to de-energize an antenna and eliminate induced voltages on the antenna is significantly reduced. This allows for the ability to record voltage changes from a sensitive volume more quickly, and thereby allow for more measurements to be performed during a given measurement process. By reducing the time needed to dissipate residual energy in the tuning circuit, the pulse sequence is less likely to interfere with signals from other tools or devices, such as communication signals and NMR or other induced signals from other locations. In addition, as some of the energy that would have been dissipated is held and reused by the tuning circuit, the amount of heat that is generated is reduced.

A further advantage of the embodiments is that the amount of energy that is dumped by the dump resistor (dump power) is reduced, as compared to conventional transmission circuits. This allows for reduced heat as noted above, and also allows for smaller, lower powered dump resistors to be used.

It will be understood that, although a single coil is discussed for each antenna, the antennas may have any number of coils, and any number of windings making up a coil. It is also noted that embodiments described herein are not limited to the specific shape, size and configuration of the coils and various components of the circuits.

Embodiments described herein can be incorporated into a variety measurement systems that apply oscillating signals to a sensitive volume. Such measurements systems include electromagnetic systems, acoustic systems and others. Examples of such systems include magnetic resonance systems such as magnetic resonance image (MM) and nuclear magnetic resonance (NMR) systems. In addition, embodiments may be incorporated into surface and/or downhole systems. An example of a downhole measurement system is discussed in conjunction with FIG. 1.

FIG. 1 illustrates an embodiment of a downhole measurement, data acquisition, and/or analysis system 10 that includes devices or systems for measurement of characteristics of a subterranean region, such as an earth formation 12. The system 10 includes a magnetic resonance apparatus such as an NMR tool 14. An example of the magnetic resonance apparatus is a wireline NMR tool. The tool 14 is configured to generate magnetic resonance data for use in estimating characteristics of a formation, such as porosity, irreducible water saturation, permeability, hydrocarbon content, and fluid viscosity.

An exemplary tool 14 includes a static magnetic field source 16 that magnetizes formation materials and an antenna assembly 18. The antenna assembly 18 includes a transmitting antenna that transmits radio frequency (RF) energy or pulsed energy that provides an oscillating magnetic field in a volume of interest, e.g., the formation 12. The antenna assembly 18 also includes a receiving antenna for detection of NMR signals in the form of measurement of magnetic fields produced by nuclei in the volume of interest. It can be appreciated that the tool 14 may include a variety of components and configurations as known in the art of nuclear magnetic resonance or magnetic resonance imaging.

The tool 14 may be configured as a component of various subterranean systems, such as wireline well logging and LWD systems. For example, the tool 14 can be incorporated within a drill string 20 including a drill bit 22, or other suitable borehole string, and deployed downhole, e.g., from a drilling rig 24 into a borehole 26 during a drilling operation. The tool 14 is not limited to the embodiments described herein, and may be deployed with alternative conveyance methods and/or any suitable type of borehole string or component (e.g., coiled tubing).

In one embodiment, the tool 14 and/or other downhole components are equipped with transmission equipment to communicate ultimately to a surface processing unit 28. Such transmission equipment may take any desired form, and different transmission media and methods may be used, such as wired, fiber optic, and/or wireless transmission methods. Additional processing units may be deployed with the borehole string. For example, a downhole electronics unit 30 includes various electronic components to facilitate receiving signals and collect data, controlling antennas, effecting impedance control, transmitting data and commands, and/or processing data downhole. The surface processing unit 28, electronics 30, the tool 14, and/or other components of the system 10 include devices as necessary to provide for storing and/or processing data collected from the tool 14 and other components of the system 10. Exemplary devices include, without limitation, at least one processor, storage, memory, input devices, output devices, and the like.

NMR measurements are performed by generating a static magnetic field ($B_0$) by the magnetic field source 16 (e.g., a permanent magnet) in a volume (the sensitive volume) within the formation. An oscillating (e.g., RF) magnetic field ($B_1$), which is at least substantially orthogonal to the static magnetic field, is generated in the sensitive formation volume using a transmitting antenna. The B1 field as generated in the sensitive volume may be referred to as a measurement signal.

The receiving antenna detects an NMR signal excited by the static and oscillating magnetic fields, and captures relaxation back to thermal equilibrium. NMR signals originate from the net magnetization of nuclei in the sensitive volume. These signals generally include a series of spin echoes (i.e. resulting in an echo train), which are detected by the tool, numerically processed, and ultimately displayed in NMR logs. The amplitude of these spin echoes can be detected as a function of time, allowing for detection of both the initial amplitude (i.e. for porosity measurement) and the signal decay, which can be used to derive other formation and fluid characteristics after the data inversion procedure.

Figure 2:
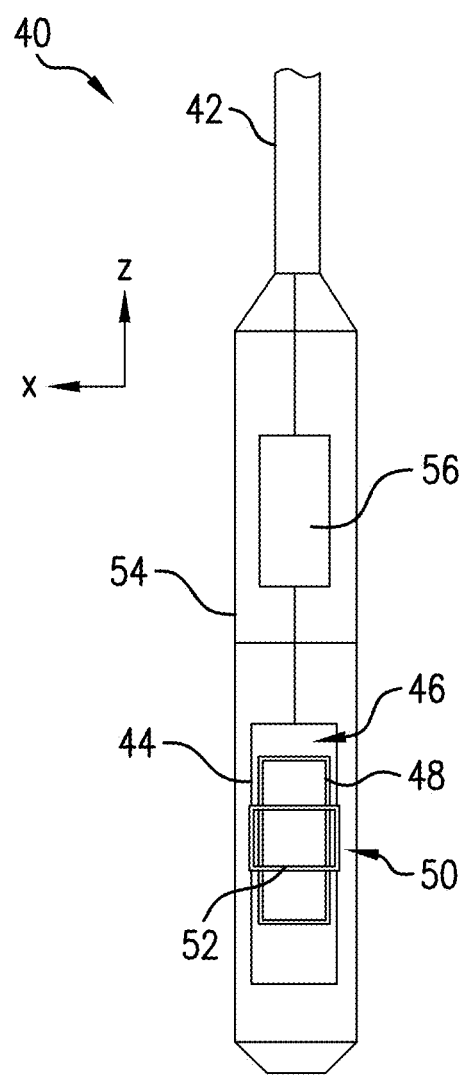
FIG. 2 depicts an embodiment of a downhole tool for performing NMR measurements.

FIG. 2 depicts an example of a measurement apparatus configured as an NMR tool 40 for logging a formation. The tool 40 may be a wireline tool in which the tool 40 is connected to the surface via a wireline 42, a LWD tool or any other suitable type of tool. The static magnetic field source includes one or more magnet assemblies 44 (also referred to as magnets). The magnet assemblies 44 described in embodiments herein are permanent magnets, but are not so limited. In one embodiment, the magnet assemblies include electromagnets, a combination of permanent magnets and electromagnets, or magnets in combination with soft magnetic materials.

The tool 40 includes one or more transmitting antennas and one or more receiving antennas. The transmitter and receiver antennas may be configured as a transceiver capable of both transmission and reception, or as separate antennas. In one embodiment, the transmitter antenna includes at least one transmitter coil electrically connected to a circuit configured for active control of the transmitting antenna, and the receiving antenna includes at least one receiver coil electrically connected to a receiver control circuit. In one embodiment, the receiver coil (or coils) is physically separate from the transmitter coil (or coils) to reduce undesired coupling.

For example, referring to FIG. 2, the tool 40 includes a transmitting antenna 46 that includes one or more transmitter coils 48, and a receiving antenna 50 that includes one or more receiver coils 52. The transmitter and/or receiver antenna may have a single or multiple loops, windings, or turns.

Other components of the tool 40 include, for example, a sonde 54 or other carrier, and an electronics unit 56 connected to the antennas 46 and 50, and/or to the magnet assembly 44. The electronics unit 56 and/or coils are connected to a surface location via the wireline 42 or other suitable telemetry system.

In an embodiment, an NMR assembly, such as the NMR tool 14 or the NMR tool 40, includes or is connected to a control system that is configured to control the transmitting antenna and the receiving antenna. The control system includes a number of switches that are controllable by a processing device (e.g., a controller) to adjust properties such as inductance, capacitance, resistive load and voltage level. The controller may be used to induce pulsed oscillating signals in a transmitting antenna as part of an NMR pulse sequence, and record signals induced in the receiving antenna.

Figure 3:
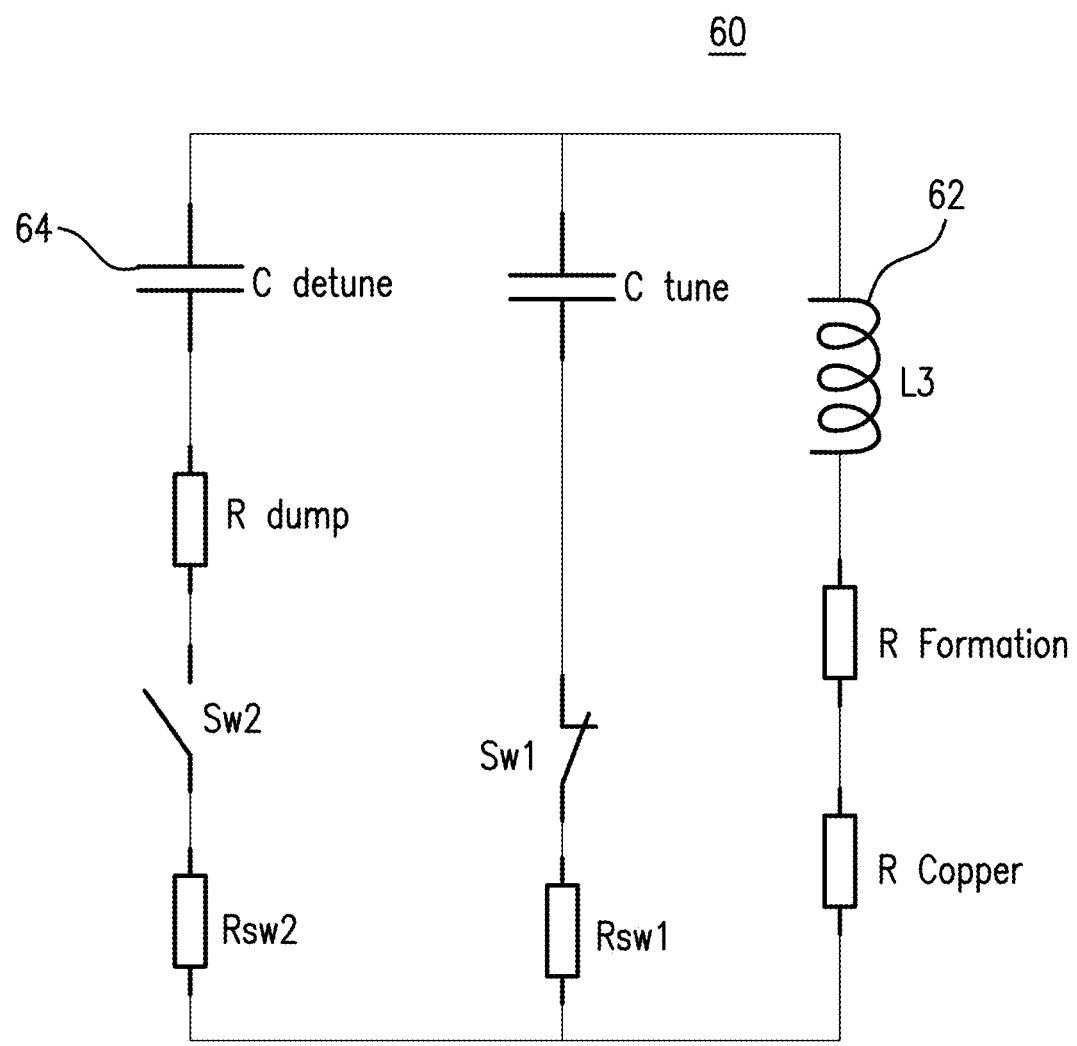
FIG. 3 depicts an embodiment of a resonant tuning circuit of a transmission device or system, including an energy storage device configured to retain energy between pulses of a pulse sequence.

FIG. 3 depicts an embodiment of a circuit 60 that can be used to generate oscillating energy signals in an energy transfer device, such as an antenna in an NMR system or other suitable measurement system. For example, the circuit can be connected to a transmitting antenna that is part of an NMR measurement assembly, such as the tool 40.

The circuit 60 is a resonant tuning circuit that is configured to create oscillating electric current in an energy transfer device. In this embodiment, the energy transfer device is an inductor 62, also denoted as inductor "L3". The inductor 62 is configured as a transmitter antenna in the form of a transmitter coil.

The circuit 60 includes a tuning capacitor $C_{tune}$, which in combination with the inductor 62, forms a tuned, parallel resonant inductance—capacitance (LC) tank circuit in which the inductor 62 is magnetically coupled to a volume being excited (the sensitive volume), such as a formation. The sensitive volume in this embodiment is represented schematically as a resistor "$R_{formaton}$". Resistance of the circuit is represented as a resistor "$R_{copper}$".

During a transmission or oscillation cycle, the tank circuit is tuned by the capacitor $C_{tune}$ according to a selected transmission frequency. This is accomplished by applying current to the circuit 60 from a drive or pulsing circuit, or other source, and closing a switch "Sw1" to couple the capacitor $C_{tune}$ to the inductor 62.

The circuit 60 also includes a dissipating component configured to be selectively connected to the inductor 62 for dissipation of residual energy in the circuit 60, including induced voltage on the inductor 62. Dissipating energy is also referred to as "dumping". The residual energy is energy that remains in the circuit 60 when the switch Sw1 is opened at the end of a pulse. At least some of the residual energy may be due to residual current on the inductor 62, imperfections in zero crossing detection circuitry, and timing errors.

For example, a resistor "$R_{dump}$" is connected in parallel with the tuning capacitor $C_{tune}$, and also in parallel with the inductor 62. The dump resistor $R_{dump}$ can be selectively coupled to the inductor 62 to increase the resistive load of the inductor 62 for dissipating or dumping any stored energy after transmission. At the end of a pulse, energy is removed from the LC tank circuit by closing a switch "Sw2" to couple the inductor 62 to the resistor $R_{dump}$.

The circuit 60 also includes a charging device or energy storage device 64, such as a capacitor. In this embodiment, the energy storage device 64 is a detuning capacitor "$C_{detune}$", which is connected in series with the dump resistor $R_{dump}$ and in parallel with the tuning capacitor $C_{tune}$ and the inductor 62. When the detuning capacitor is coupled to the inductor 62 at the end of a pulse (of a pulse sequence), the detuning capacitor $C_{detune}$ interrupts oscillation by momentarily (e.g., a time period less than or equal to a time between pulses) holding energy therein. The held energy may then be used to facilitate generating the next or successive pulse in a pulse sequence. As discussed further below, the energy storage device 64, by storing some of the energy, allows for the oscillations to die out more quickly. In other words, the energy storage device 64 acts as a damper and reduces the amount of time needed between pulses to remove any residual energy.

The circuit 60 is connected to additional circuitry and/or components. For example, a drive circuit or pulsing circuit is used to apply energy to the circuit 60 in discrete pulses. A controller may be configured to control the pulsing circuit and the switches on the circuit 60. The controller thus is configured to control properties of the inductor and the circuit, including the resistive load, the capacitance, and/or inductance. The controller may also be configured to perform other functions, such as controlling properties of a receive antenna (which may be the inductor 62 or a separate antenna), data acquisition and/or analysis.

Figure 4:
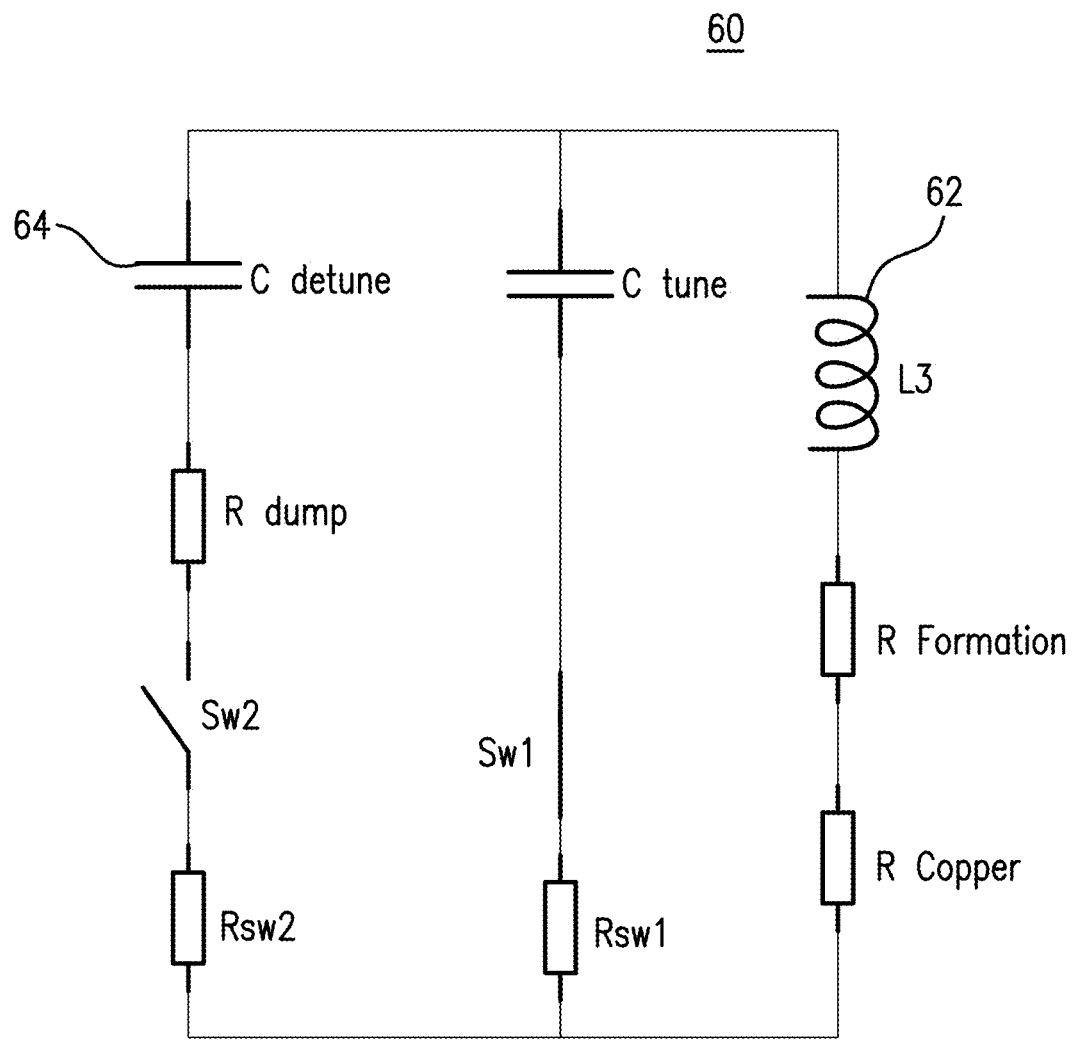
FIG. 4 depicts a state of the tuning circuit when the transmission device is in a transmit mode.
Figure 5:
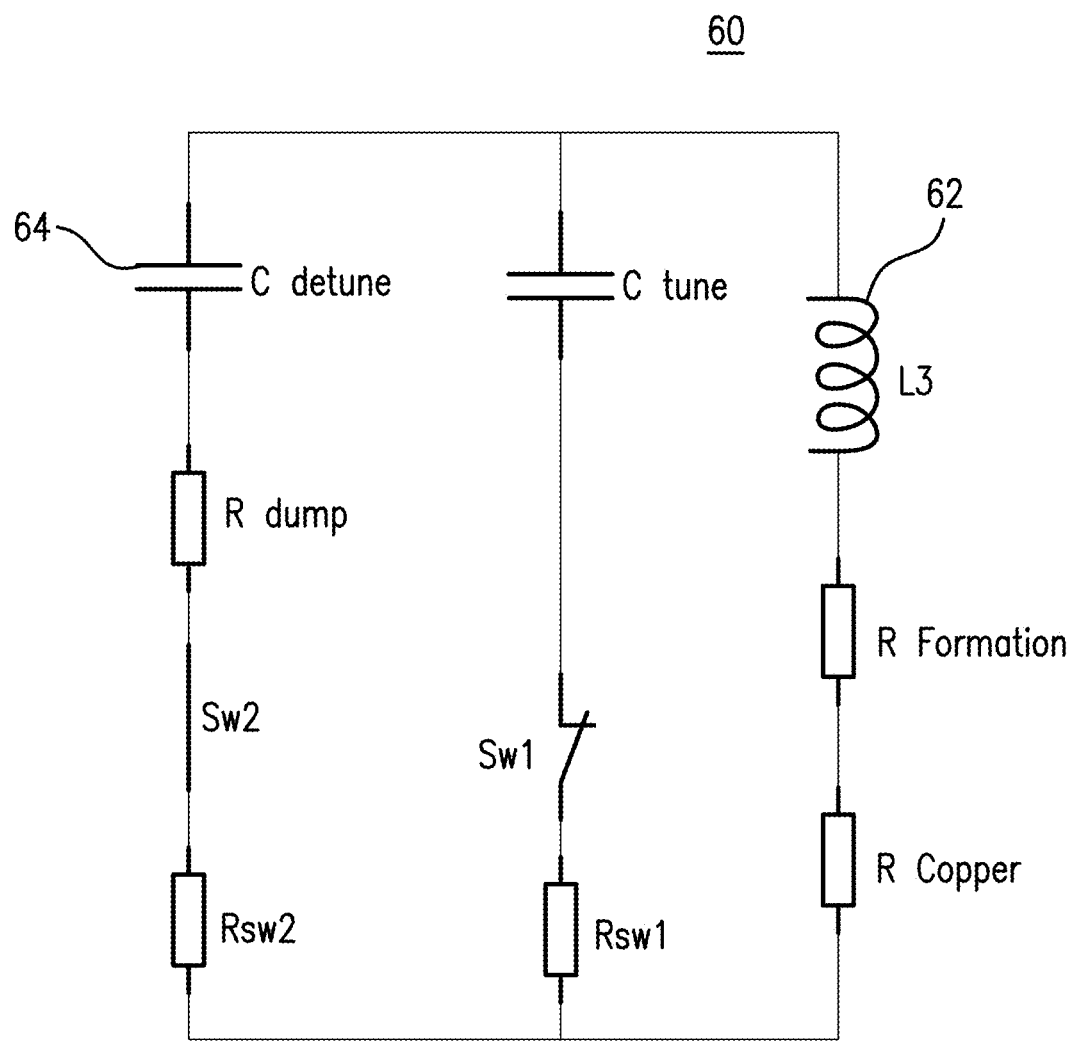
FIG. 5 depicts a state of the tuning circuit when the transmission device is in a dump mode.
Figure 6:
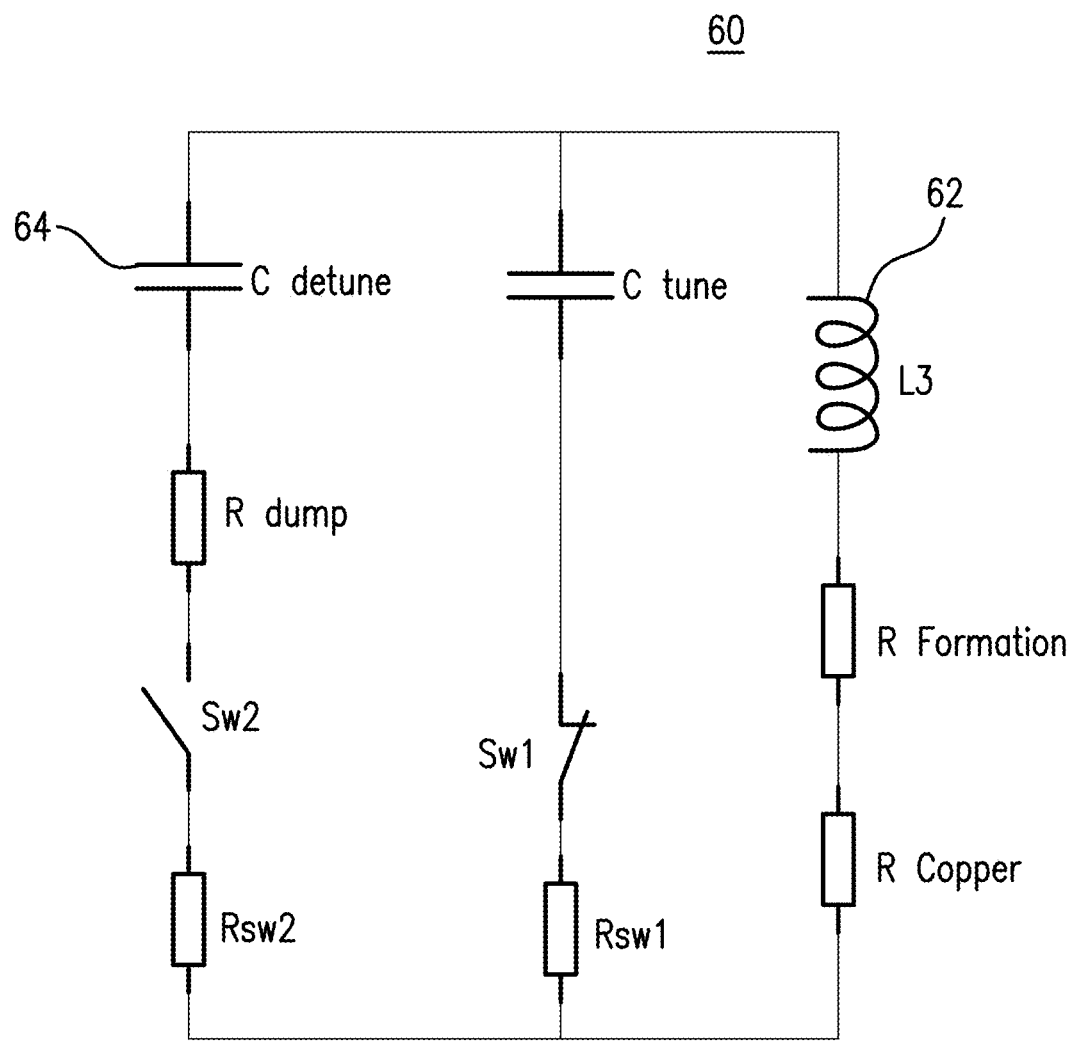
FIG. 6 depicts a state of the tuning circuit subsequent to the dump mode and prior to a next or successive transmit mode.

FIGS. 4-6 depict aspects of an embodiment of a method of generating and transmitting a pulsed oscillation signal. The method may be performed as part of an NMR or other measurement method, or as part of any suitable process or method in which pulses or an oscillating signal are generated. This embodiment is discussed in conjunction with an example of an NMR tool (e.g., the tool 14 and/or the tool 40) and NMR measurement process or method, but is not so limited.

The method includes a switching sequence that is performed during a given oscillation cycle to generate a pulse, and that is repeated for each pulse of a pulse sequence. The switching sequence is repeated for each pulse, and may be controlled by the controller and/or other processor. In the following, various switches are controlled during different operating modes, including a transmit mode, an acquisition mode and a dump mode. FIGS. 4-6, which are provided for illustrative purposes and are not intended to be limiting, show the positions (open and closed) of the switches Sw1 and Sw2 during each mode of an oscillation cycle.

In the following example, the method and switching sequence include a number of stages. In an embodiment, the stages are performed in the order described. However, some stages may be omitted or performed in a different order.

At a first stage, the NMR tool is placed is in a transmit mode, during which an antenna or transmitter coil (i.e., the inductor 62) transmits measurement signals. During the transmit mode, the switches are set as shown in FIG. 4. The switch Sw2 is turned off (open) so that the resistor $R_{dump}$ and the detuning capacitor $C_{detune}$ are decoupled from the transmitting coil.

At this stage, the switch Sw1 is turned on (closed), and a pulsing circuit drives RF pulses to the transmitter coil. The tuning capacitor $C_{tune}$ tunes the antenna tank response to a predefined resonance frequency. The duration of the transmit mode, and the period of time during which the circuit is in the configuration of FIG. 4, corresponds to a pulse duration.

At the end of the pulse duration, the NMR tool is placed in an acquisition mode and dump mode. At a second stage, during the acquisition mode, signals (voltages representing NMR precess) induced in a receive antenna are measured. The measured signals include pulse echoes, which may be measured and inverted to derive, for example, T1 and/or T2 distributions. The inductor 62 may be configured as a receiving antenna, or a separate receiving antenna may be used.

During the acquisition mode, NMR signals are received by the receiver coil, and then amplified, filtered, digitalized, and processed. The processed signals may then be used for various purposes, such as estimating properties of the sensitive volume. For example, if the sensitive volume is a formation, the properties may include porosity and permeability.

At a third stage, shown in FIG. 5, after the transmit mode and at the end of the pulse duration, the tool moves to a dump mode in order to "dump" or remove any residual energy in the circuit 60 and/or inductor 62. It is noted that the dump mode and acquisition modes may be performed over the same time period after a pulse.

In the dump mode, switch Sw2 is turned on (closed) to couple the dump resistor $R_{dump}$ to the inductor 62 to dissipate residual energy once RF transmission completes. The dump mode, in an embodiment, is commenced at a time corresponding to zero current crossing at the inductor 62.

Also, during the dump mode, the switch Sw1 is opened, and the detuning capacitor $C_{detune}$ dominates oscillation and holds some of the energy from the tank circuit. This is in contrast to conventional pulse sequences, in which the switch Sw1 would normally remain closed. By instead opening the switch Sw1, energy is transferred to the $R_{dump}$ and the $C_{detune}$ capacitor.

At a fourth stage, shown in FIG. 6, switch Sw2 is then opened. At this stage, both switches are opened, and the detuning capacitor $C_{detune}$ holds some of the residual energy. In this way, instead of all of the energy from the tank being dissipated via the dump circuit, some of the energy is retained, and can be reused in the next cycle.

After the fourth stage, the method is repeated to generate the next pulse in the pulse sequence. For example, at the next transmit mode, the Sw1 switch is closed, and the stored energy from the detuning capacitor $C_{detune}$ discharges into the circuit 60 and facilitates ramping up the next pulse.

It is noted that the switches may be of any suitable type. Examples of switches include field effect transistors (FETs). MOSFETs, transistors, relays, and PIN diodes.

The switching sequence results in a number of beneficial effects. For example, as some of the residual energy is retained in the energy storage device at zero current crossing, the oscillation is damped more quickly, which reduces rippling and allows for shorter inter-echo spacing (TE). This allows for more applications, in that recording of received signals can be performed much faster. For example, the system described herein has been found to allow for measurements within about 200 milliseconds (ms) or less, as compared to about 300 ms in conventional systems. In addition, as some of the energy is not dissipated but is instead reused, the amount of heat generated by the circuit is reduced.

Figure 7:
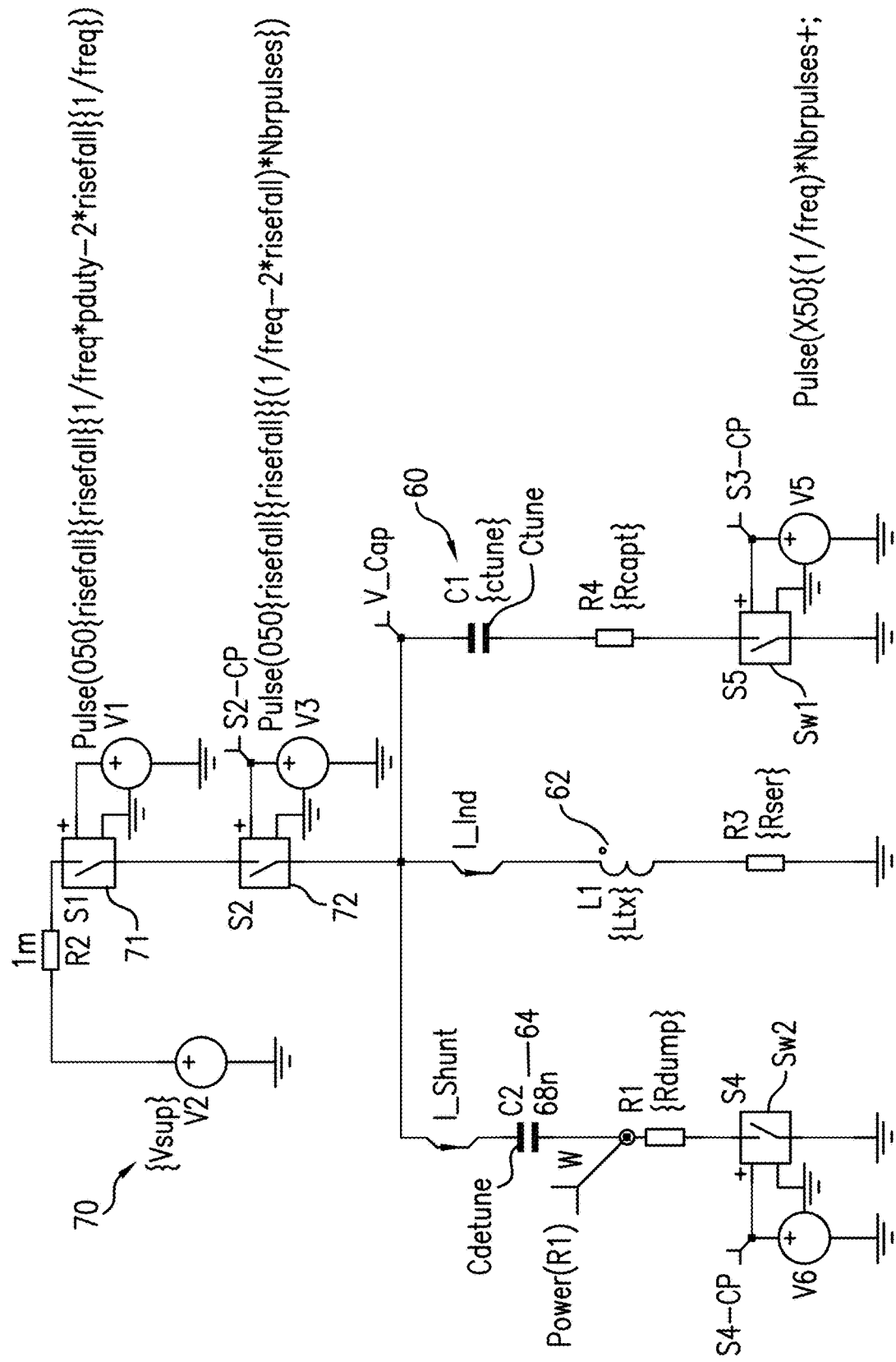
FIG. 7 is a schematic diagram of an example of a transmission device of a nuclear magnetic resonance (NMR) measurement system, including the tuning circuit of FIG. 3 and a pulsing or driving circuit.

FIG. 7 depicts circuitry of an example of an NMR transmission device, which includes the resonant circuit 60 and a pulsing circuit 70. The pulsing circuit is connected to the circuit 60 and configured to apply pulsed electrical signals to the circuit 60. The pulsing circuit includes a voltage supply V2 that is selectively applied to the circuit 60 using a switch assembly. The switch assembly includes a switch 71 connected to a voltage supply V1, and a switch 72 connected to a voltage supply V2.

Figure 8:
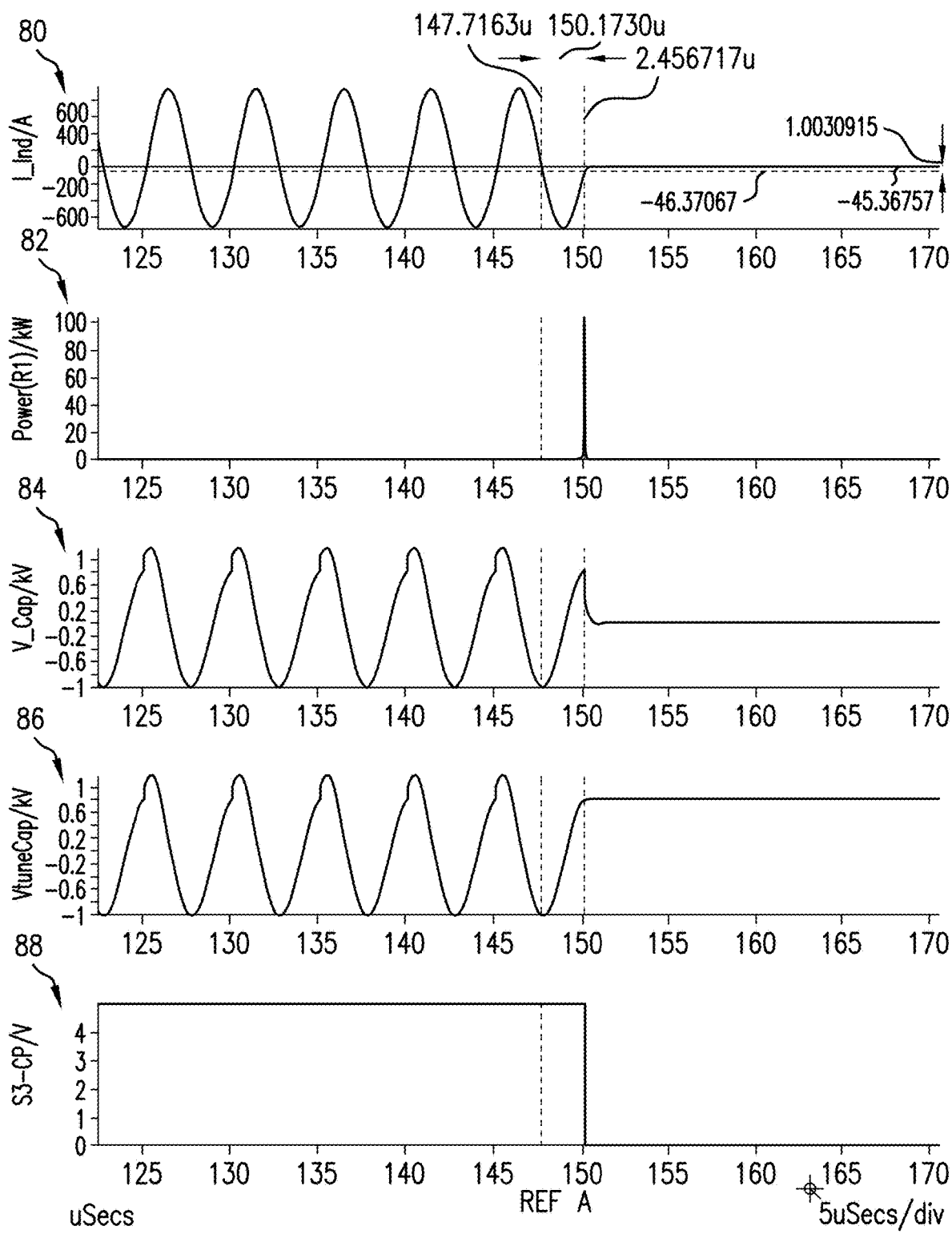
FIG. 8 depicts a number of graphs representing an example of a pulse emitted via the transmission device of FIG. 7.
Figure 9:
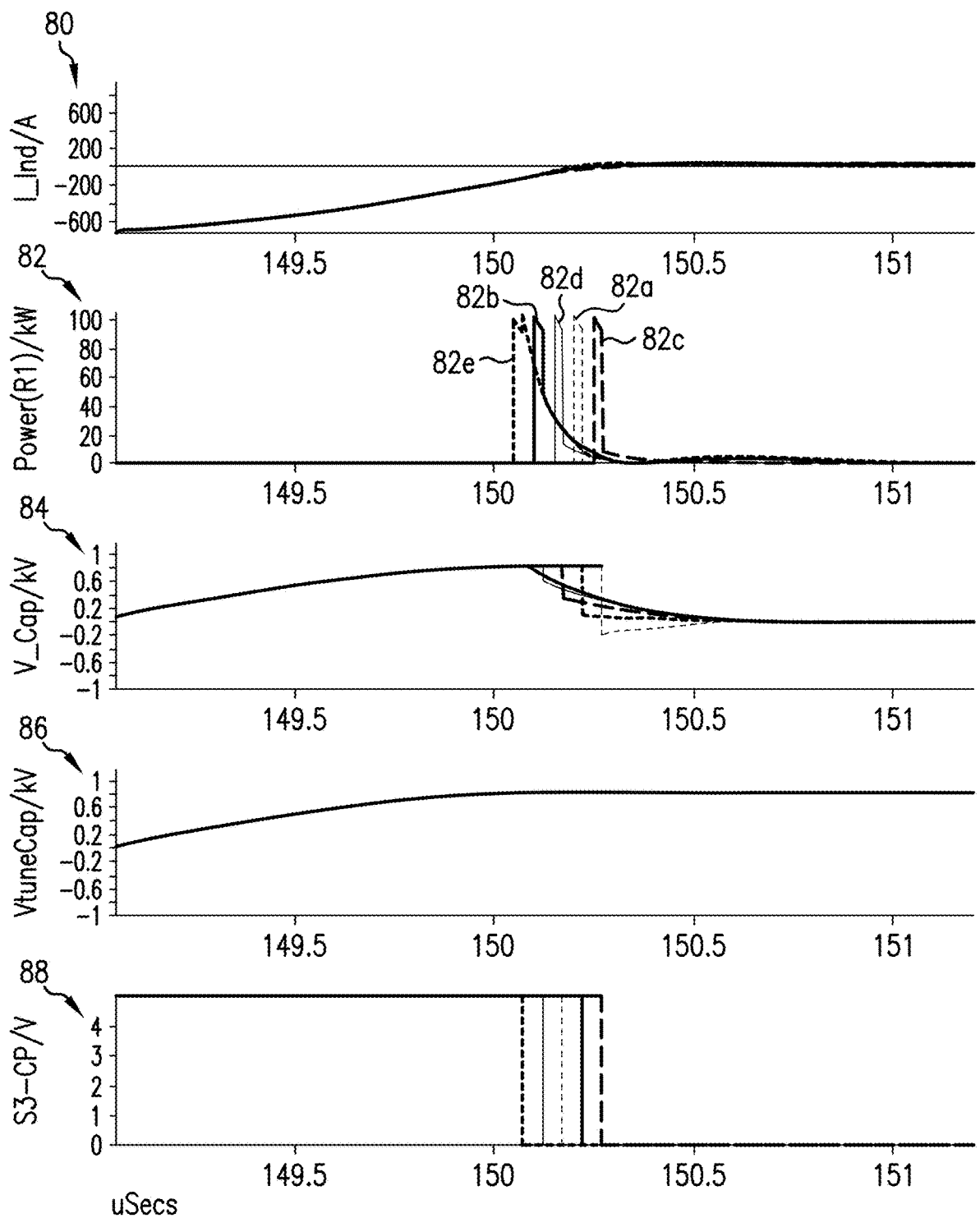
FIG. 9 depicts portions of the graphs of FIG. 8.

FIGS. 8-10 depict examples of oscillating pulses generated by the NMR transmission device of FIG. 7. FIGS. 8-10 also illustrate some advantages of the embodiments described herein. One such advantage includes reduced rippling effects as a result of improved damping. Another advantage is that the dump power of the dump resistor is reduced, allowing for lower power capacitors to be used.

FIG. 8 includes a number of graphs that show properties of an oscillating pulse generated using the pulsing circuit 70 and the resonant circuit 60. A graph 80 shows current ("I_ind") in the inductor 62 (antenna). As shown, the current oscillates with a selected pulse amplitude and frequency for a given pulse duration. A graph 82 shows the dump power ("Power(R1)") of the dump resistor $R_{dump}$ at the end of the pulse. The graph 84 shows the voltage between the tuning capacitor $C_{tune}$ and the pulsing circuit ("V_Cap"), and the graph 86 shows the voltage at the tuning capacitor ("VtuneCap"). Graph 88 shows the voltage at the switch Sw1 while the switch is closed during a pulse. In this example, the resistance of the dump resistor is about 20 ohms The above graphs illustrate one advantage of the embodiment. The energy recuperation at the detune capacitor allows for faster damping, and thereby eliminates any significant rippling, as can be seen from the graph 80.

In addition to faster damping, embodiments provide for a reduction in dump power, as some of the energy contributing to the residual current is reduced. FIG. 9 depicts a portion of the graphs 80, 82, 84, 86 and 88 over a time period that includes the time at which the current crosses zero.

FIG. 9 also shows the effect of timing errors on dump power. For example, graph 82 includes curves 82a-82e, in which each curve represents the dump power for different timing errors. Curve 82a shows dump power for a timing error of −100 nanoseconds (ns), curve 82b shows dump power for a timing error of −50 ns, and curve 82c shows dump power for a timing error of zero ns. The average dump power shown by curves 82a, 82b and 82c are 52 Watts (W), 29.5 W and 15 W, respectively.

Curve 82d shows dump power for a timing error of 50 ns, where the average dump power is 10 W. Curve 82e shows sump power for a timing error of 100 ns, having an average dump power of 13 W.

Figure 10A:
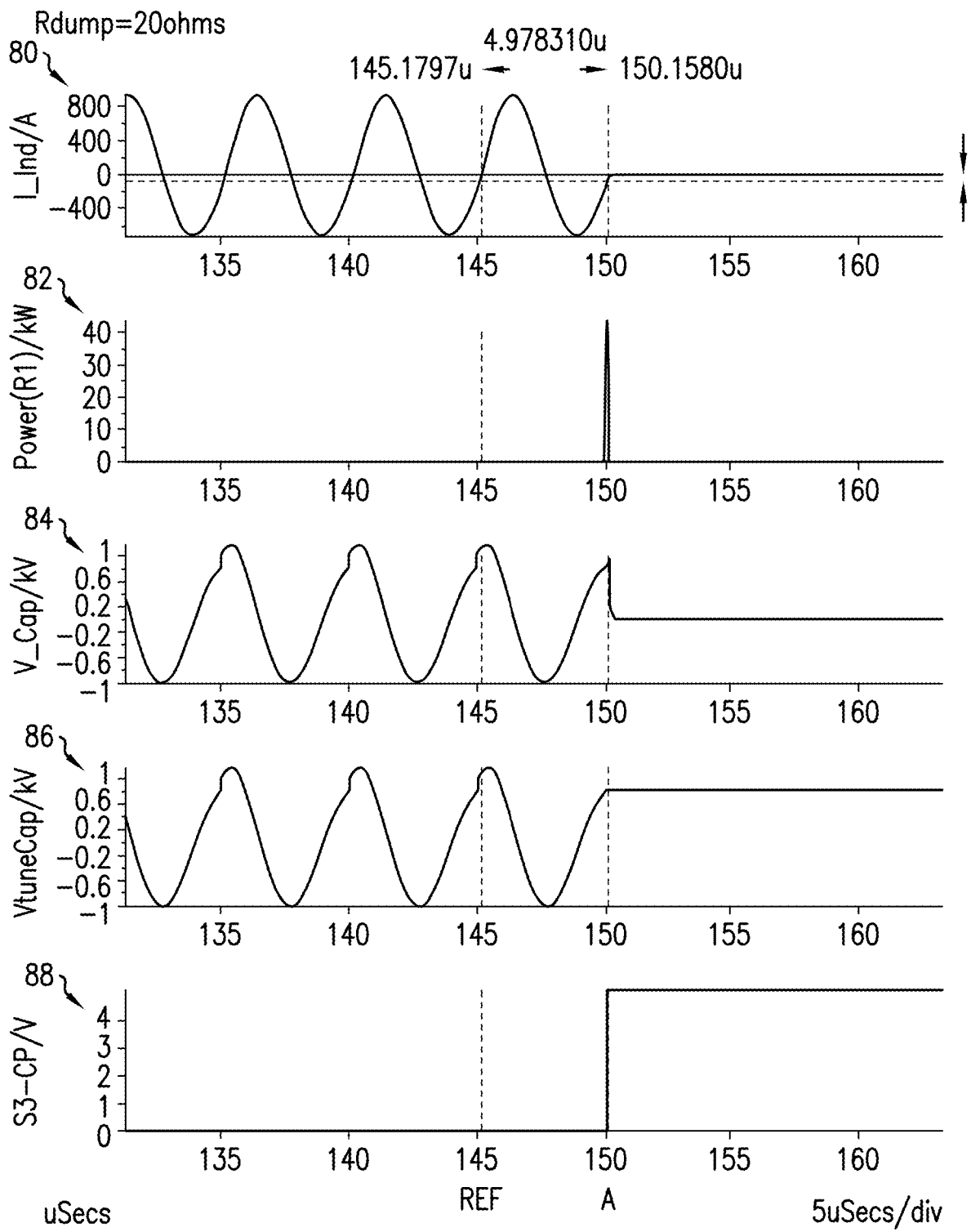
FIG. 10 depicts a number of graphs that illustrate effects on dump power of various frequencies.
Figure 10B:
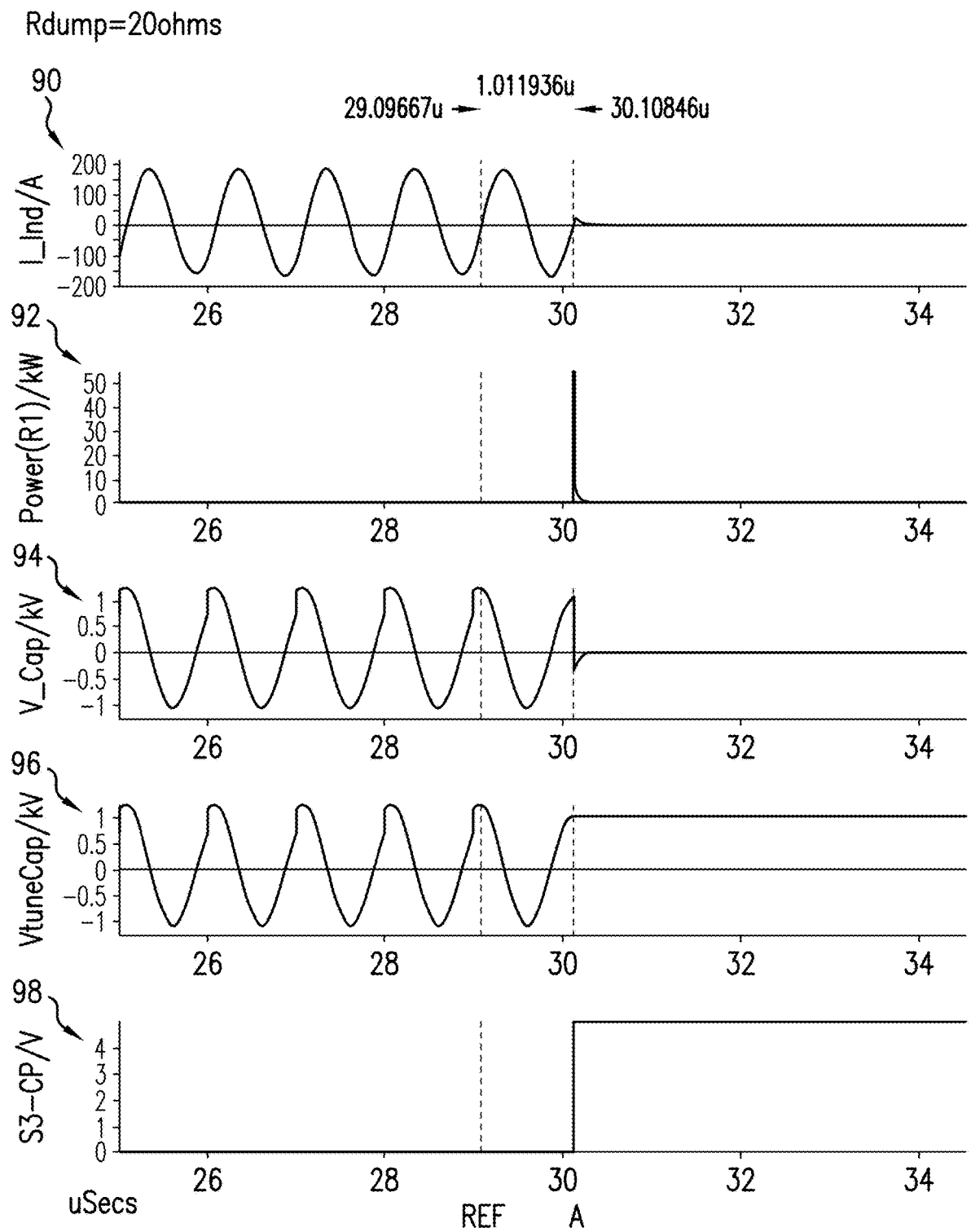
Figure 10C:
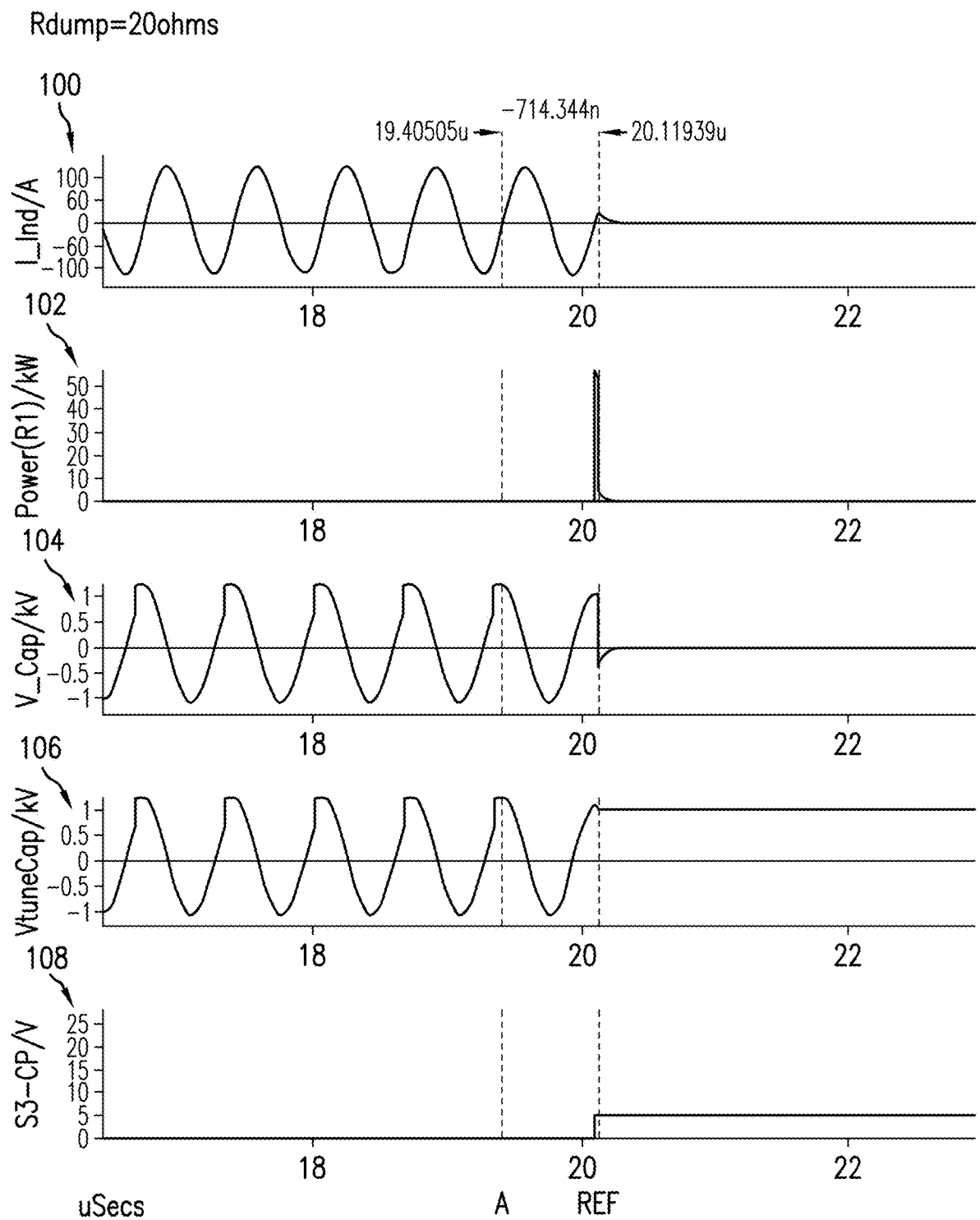

In addition to timing error, dump power can be affected by oscillation frequency, which is typically a radiofrequency (RF). FIGS. 10A-10C depict examples of pulses generated with different frequencies. FIG. 10A corresponds to the pulse of FIG. 8, which has a frequency of 200 kHz. The average dump power for this pulse is 8.8 W.

FIG. 10B includes a graph 90 of current I_ind in the inductor 62, a graph 92 shows the dump power Power(R1), a graph 94 shows the voltage V_Cap, and a graph 96 shows the voltage VtuneCap. A graph 98 shows the voltage at the switch Sw1. In this example, the average dump power is 6.2 W.

FIG. 10C includes a graph 100 of current I_ind in the inductor 62, a graph 102 shows the dump power Power(R1), a graph 104 shows the voltage V_Cap, and a graph 106 shows the voltage VtuneCap. A graph 108 shows the voltage at the switch Sw1. In this example, the average dump power is about 6 W.

The measurement apparatuses and antenna configurations described herein may be used in various methods for estimating formation characteristics. An example of a method includes taking downhole NMR measurements as part of well logging and/or LWD operation. NMR measurements can be performed to estimate various properties of a formation, such as porosity, permeability and fluid content.

An example of a method is described as follows. In this example, the method is performed in conjunction with the system 10 of FIG. 1, but is not so limited. The method may be used with any device or system that performs NMR measurements and/or receives NMR measurement data.

The method may be performed in conjunction with the system 10 and/or embodiments of the NMR apparatus, but is not limited thereto. The method includes one or more stages described below. In one embodiment, the method includes the execution of all of the stages in the order described. However, certain stages may be omitted, stages may be added, or the order of the stages changed.

In a first stage, an NMR or other magnetic resonance measurement tool is deployed into a borehole. In one embodiment, the tool (e.g., the tool 14 and/or the tool 40) is deployed as part of an open hole wireline operation, or during drilling as part of a LWD operation. The tool includes a permanent magnet, and physically separated transmitting and receiving antennas as described above.

In the second stage, NMR data is acquired by performing an NMR measurement. The NMR measurement includes applying a static magnetic field $B_0$ to the surrounding formation volume, and transmitting a radiofrequency (RF) or other pulsed signal into a subterranean region (e.g., a hydrocarbon or other energy bearing formation) that generates an oscillating magnetic field $B_1$. The receiving antenna detects NMR signals from the volume in response to the interaction between the nuclear spins of interest and the static and oscillating magnetic fields, and generates NMR data by measuring spin echo trains from the formation.

During generation and transmission of the measurement signal, as well as detection of signals from the volume, properties of the transmitting antenna and the receiving antenna are controlled or adjusted to reduce or minimize mutual coupling. For example, the transmitting antenna and the receiving antenna are operated according to the switching sequence as discussed above.

In the third stage, the NMR data is analyzed to estimate characteristics of the formation. For example, spin echo data is converted to a distribution of $T_2$ relaxation times. $T_2$ distributions can then be used to estimate permeability and fluid properties, or to perform fluid typing or more advanced petrophysical analyses.

The NMR data may be utilized in various ways. For example, permeability and porosity estimations can be used to inform the control of various operational parameters (e.g., rate of penetration, weight on bit, borehole direction, etc.) during a drilling operation. In addition, NMR data can be used to evaluate operations and/or plan subsequent operations, such as drilling, production and stimulation operations. For example, NMR data can be used to estimate fracture properties in a formation, which can be used to plan, control and/or evaluate hydraulic fracturing operations.

Set forth below are some embodiments of the foregoing disclosure:

Embodiment 1: A transmission device for generating oscillating signals, comprising an energy transfer device configured to apply an oscillating signal to a sensitive volume; and a resonant tuning circuit including the energy transfer device, the tuning circuit including a tuning capacitor configured to cause the tuning circuit to resonate at a selected frequency, and an energy storage device; and a controller configured to apply a pulse sequence to the tuning circuit having a series of pulses, the energy storage device configured to retain electrical energy at an end of a first pulse, and discharge the electrical energy to the tuning circuit at an onset of a next pulse of the pulse sequence.

Embodiment 2: The device as in any prior embodiment, wherein the energy transfer device includes an inductive coil.

Embodiment 3: The device as in any prior embodiment, wherein the energy transfer device and the tuning circuit are configured to emit a nuclear magnetic resonance (NMR) pulse sequence into the sensitive volume.

Embodiment 4: The device as in any prior embodiment, wherein the tuning circuit includes a dissipating component configured to dissipate residual energy from the tuning circuit at the end of the first pulse, the energy storage device configured to retain a portion of the residual energy and discharge the portion to the tuning circuit at the onset of the next pulse.

Embodiment 5: The device as in any prior embodiment, wherein the energy storage device includes a detuning capacitor, the dissipating component includes a dump resistor in series with the detuning capacitor, and the detuning capacitor and the dump resistor are connected in parallel to the tuning capacitor and the inductive coil.

Embodiment 6: The device as in any prior embodiment, wherein the tuning capacitor is connected in series to a first switch, and the detuning capacitor is connected in series to a second switch.

Embodiment 7: The device as in any prior embodiment, wherein the tuning circuit is configured to be put into a transmit mode to emit an oscillating pulse signal during a pulse duration, and subsequently put into a dump mode at an end of the pulse duration to dissipate the residual energy.

Embodiment 8: The device as in any prior embodiment, wherein the first switch is closed and the second switch is open during the transmit mode, and the first switch is open and the second switch is closed during the dump mode, the detuning capacitor retaining the portion of the residual energy during the dump mode.

Embodiment 9: The device as in any prior embodiment, wherein the first switch is closed and the second switch is opened at an onset of the next pulse, the detuning capacitor configured to release the portion of the residual energy during the next pulse.

Embodiment 10: The device as in any prior embodiment, wherein the device is configured to be deployed in a borehole in a subterranean region, the device connected to a processor configured estimate a property of the subterranean region based on detecting signals from the sensitive volume as a result of the emitted pulse sequence.

Embodiment 11: A method of generating oscillating signals comprising disposing a transmission device proximate to a sensitive volume, the transmission device including an energy transfer device configured to apply an oscillating signal to the sensitive volume, and a resonant tuning circuit including the energy transfer device, the tuning circuit including a tuning capacitor configured to cause the tuning circuit to resonate at a selected frequency, and an energy storage device; and applying, by a controller, a pulse sequence having a series of pulses to the tuning circuit, wherein the applying includes retaining electrical energy in the energy storage device at an end of a first pulse, and discharging the electrical energy to the tuning circuit at an onset of a next pulse of the pulse sequence.

Embodiment 12: The method as in any prior embodiment, wherein the energy transfer device includes an inductive coil.

Embodiment 13: The method as in any prior embodiment, wherein applying the pulse sequence is applied as a nuclear magnetic resonance (NMR) pulse sequence into the sensitive volume.

Embodiment 14: The method as in any prior embodiment, wherein the tuning circuit includes a dissipating component configured to dissipate residual energy from the tuning circuit at the end of the first pulse, and applying the pulse sequence includes retaining a portion of the residual energy at the energy storage device and discharging the portion to the tuning circuit at the onset of the next pulse.

Embodiment 15: The method as in any prior embodiment, wherein the energy storage device includes a detuning capacitor, the dissipating component includes a dump resistor in series with the detuning capacitor, and the detuning capacitor and the dump resistor are connected in parallel to the tuning capacitor and the inductive coil.

Embodiment 16: The method as in any prior embodiment, wherein the tuning capacitor is connected in series to a first switch, and the detuning capacitor is connected in series to a second switch.

Embodiment 17: The method as in any prior embodiment, wherein applying the pulse sequence includes putting the tuning circuit into a transmit mode to emit an oscillating pulse signal during a pulse duration, and subsequently putting the tuning circuit into a dump mode at an end of the pulse duration to dissipate the residual energy.

Embodiment 18: The method as in any prior embodiment, wherein the first switch is closed and the second switch is open during the transmit mode, and the first switch is open and the second switch is closed during the dump mode, the detuning capacitor retaining the portion of the residual energy during the dump mode.

Embodiment 19: The method as in any prior embodiment, wherein the first switch is closed and the second switch is opened at an onset of the next pulse, the detuning capacitor releasing the portion of the residual energy during the next pulse.

Embodiment 20: The method as in any prior embodiment, wherein the transmission device is disposed in a borehole in a subterranean region, the device connected to a processor configured estimate a property of the subterranean region based on detecting signals from the sensitive volume as a result of the emitted pulse sequence.

In connection with the teachings herein, various analyses and/or analytical components may be used, including digital and/or analog subsystems. The system may have components such as a processor, storage media, memory, input, output, communications link (wired, wireless, pulsed mud, optical or other), user interfaces, software programs, signal processors and other such components (such as resistors, capacitors, inductors, etc.) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user, or other such personnel, in addition to the functions described in this disclosure.

The use of the terms "a" and "an" and "the" and similar referents in the context of describing the invention (especially in the context of the following claims) are to be construed to cover both the singular and the plural, unless otherwise indicated herein or clearly contradicted by context. Further, it should be noted that the terms "first," "second," and the like herein do not denote any order, quantity, or importance, but rather are used to distinguish one element from another. The terms "about", "substantially" and "generally" are intended to include the degree of error associated with measurement of the particular quantity based upon the equipment available at the time of filing the application. For example, "about" and/or "substantially" and/or "generally" can include a range of ±8% or 5%, or 2% of a given value.

The teachings of the present disclosure may be used in a variety of well operations. These operations may involve using one or more treatment agents to treat a formation, the fluids resident in a formation, a wellbore, and/or equipment in the wellbore, such as production tubing. The treatment agents may be in the form of liquids, gases, solids, semi-solids, and mixtures thereof. Illustrative treatment agents include, but are not limited to, fracturing fluids, acids, steam, water, brine, anti-corrosion agents, cement, permeability modifiers, drilling muds, emulsifiers, demulsifiers, tracers, flow improvers etc. Illustrative well operations include, but are not limited to, hydraulic fracturing, stimulation, tracer injection, cleaning, acidizing, steam injection, water flooding, cementing, etc.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited.

What is claimed is:

1. A device for generating oscillating signals, comprising:
 an energy transfer device configured to apply an oscillating signal to a sensitive volume; and
 a resonant tuning circuit including the energy transfer device, the tuning circuit including a tuning capacitor configured to cause the tuning circuit to resonate at a selected frequency, and an energy storage device; and
 a controller configured to apply a pulse sequence to the tuning circuit having a series of pulses, the energy storage device configured to retain electrical energy at an end of a first pulse, and discharge the electrical energy to the tuning circuit at an onset of a next pulse of the pulse sequence.

2. The device of claim 1, wherein the energy transfer device includes an inductive coil.

3. The device of claim 2, wherein the energy transfer device and the tuning circuit are configured to emit a nuclear magnetic resonance (NMR) pulse sequence into the sensitive volume.

4. The device of claim 2, wherein the tuning circuit includes a dissipating component configured to dissipate residual energy from the tuning circuit at the end of the first pulse, the energy storage device configured to retain a portion of the residual energy and discharge the portion to the tuning circuit at the onset of the next pulse.

5. The device of claim 4, wherein the energy storage device includes a detuning capacitor, the dissipating component includes a dump resistor in series with the detuning capacitor, and the detuning capacitor and the dump resistor are connected in parallel to the tuning capacitor and the inductive coil.

6. The device of claim 5, wherein the tuning capacitor is connected in series to a first switch, and the detuning capacitor is connected in series to a second switch.

7. The device of claim 6, wherein the tuning circuit is configured to be put into a transmit mode to emit an oscillating pulse signal during a pulse duration, and subsequently put into a dump mode at an end of the pulse duration to dissipate the residual energy.

8. The device of claim 7, wherein the first switch is closed and the second switch is open during the transmit mode, and the first switch is open and the second switch is closed during the dump mode, the detuning capacitor retaining the portion of the residual energy during the dump mode.

9. The device of claim 8, wherein the first switch is closed and the second switch is opened at an onset of the next pulse, the detuning capacitor configured to release the portion of the residual energy during the next pulse.

10. The device of claim 1, wherein the device is configured to be deployed in a borehole in a subterranean region, the device connected to a processor configured estimate a property of the subterranean region based on detecting signals from the sensitive volume as a result of the emitted pulse sequence.

11. A method of generating oscillating signals comprising:
disposing a transmission device proximate to a sensitive volume, the transmission device including an energy transfer device configured to apply an oscillating signal to the sensitive volume, and a resonant tuning circuit including the energy transfer device, the tuning circuit including a tuning capacitor configured to cause the tuning circuit to resonate at a selected frequency, and an energy storage device; and
applying, by a controller, a pulse sequence having a series of pulses to the tuning circuit, wherein the applying includes retaining electrical energy in the energy storage device at an end of a first pulse, and discharging the electrical energy to the tuning circuit at an onset of a next pulse of the pulse sequence.

12. The method of claim 11, wherein the energy transfer device includes an inductive coil.

13. The method of claim 12, wherein applying the pulse sequence is applied as a nuclear magnetic resonance (NMR) pulse sequence into the sensitive volume.

14. The method of claim 12, wherein the tuning circuit includes a dissipating component configured to dissipate residual energy from the tuning circuit at the end of the first pulse, and applying the pulse sequence includes retaining a portion of the residual energy at the energy storage device and discharging the portion to the tuning circuit at the onset of the next pulse.

15. The method of claim 14, wherein the energy storage device includes a detuning capacitor, the dissipating component includes a dump resistor in series with the detuning capacitor, and the detuning capacitor and the dump resistor are connected in parallel to the tuning capacitor and the inductive coil.

16. The method of claim 15, wherein the tuning capacitor is connected in series to a first switch, and the detuning capacitor is connected in series to a second switch.

17. The method of claim 16, wherein applying the pulse sequence includes putting the tuning circuit into a transmit mode to emit an oscillating pulse signal during a pulse duration, and subsequently putting the tuning circuit into a dump mode at an end of the pulse duration to dissipate the residual energy.

18. The method of claim 17, wherein the first switch is closed and the second switch is open during the transmit mode, and the first switch is open and the second switch is closed during the dump mode, the detuning capacitor retaining the portion of the residual energy during the dump mode.

19. The method of claim 18, wherein the first switch is closed and the second switch is opened at an onset of the next pulse, the detuning capacitor releasing the portion of the residual energy during the next pulse.

20. The method of claim 11, wherein the transmission device is disposed in a borehole in a subterranean region, the device connected to a processor configured estimate a property of the subterranean region based on detecting signals from the sensitive volume as a result of the emitted pulse sequence.

* * * * *